United States Patent [19]
Nichter

[11] Patent Number: 6,079,607
[45] Date of Patent: Jun. 27, 2000

[54] METHOD FOR HIGH FREQUENCY BONDING

[75] Inventor: Larry W. Nichter, Dallas, Tex.

[73] Assignee: Texas Instruments Incorporated, Dallas, Tex.

[21] Appl. No.: 09/069,404

[22] Filed: Apr. 29, 1998

Related U.S. Application Data

[60] Provisional application No. 60/044,420, Apr. 29, 1997.

[51] Int. Cl.$^7$ .............................. B23K 1/06; B23K 5/20; B23K 20/10; B23Q 15/00; B23Q 16/00
[52] U.S. Cl. .......................... 228/102; 228/1.1; 228/11; 228/110.1
[58] Field of Search ................. 228/102, 110.1, 228/111, 1.1, 8, 9, 11

[56] References Cited

U.S. PATENT DOCUMENTS

| | | | |
|---|---|---|---|
| 3,693,158 | 9/1972 | Uthe | 340/172 R |
| 3,784,079 | 1/1974 | Spanjer | 228/1 |
| 4,040,885 | 8/1977 | Hight et al. | 156/378 |
| 4,341,574 | 7/1982 | Landes | 156/64 |
| 4,438,880 | 3/1984 | Smith et al. | 228/1 |
| 4,555,052 | 11/1985 | Kurtz et al. | 228/104 |
| 4,586,642 | 5/1986 | Drebelbis et al. | 228/4.5 |
| 4,597,519 | 7/1986 | Kurtz et al. | 228/102 |
| 4,687,897 | 8/1987 | McKiel, Jr. | 219/56.21 |
| 4,696,425 | 9/1987 | Landes | 228/1.1 |
| 4,888,514 | 12/1989 | Takahashi et al. | 310/316 |
| 4,939,402 | 7/1990 | Hirayama et al. | 310/316 |
| 4,965,532 | 10/1990 | Sakurai | 331/4 |
| 5,083,087 | 1/1992 | Fox et al. | 324/537 |
| 5,365,139 | 11/1994 | Kasuga et al. | 310/316 |
| 5,433,369 | 7/1995 | Okumura | 228/110.1 |
| 5,463,197 | 10/1995 | Miyazaki | 219/56.22 |
| 5,595,330 | 1/1997 | Buice et al. | 228/102 |
| 5,884,835 | 3/1999 | Kajiwara et al. | 228/110.1 |
| 5,892,315 | 4/1999 | Gipson et al. | 310/317 |
| 5,893,508 | 4/1999 | Oh | 228/4.5 |
| 5,897,569 | 4/1999 | Kellogg et al. | 606/169 |
| 5,900,690 | 5/1999 | Gipson et al. | 310/316 |

*Primary Examiner*—Patrick Ryan
*Assistant Examiner*—Kiley Stoner
*Attorney, Agent, or Firm*—Wade James Brady, III; Frederick J. Telecky, Jr.

[57] ABSTRACT

A method of forming a ball weld during the fabrication of a semiconductor device wherein a pad (3) and a gold ball (9) to be bonded to the pad is provided over the pad. Ultrasonic energy from an ultrasonic energy source (11) is applied to the ball to soften the ball while concurrently applying a compressive force to the ball to force the ball against the pad. Reflections of the ultrasonic energy are monitored to provides an indication of completion of the bond of the ball to the pad from the application of energy and compressive force to the ball. The application of energy to the ball is terminated responsive to detecting a parameter which provides an indication of completion of the bond. A preferred embodiment of the step of detecting includes providing a piezoelectric device (13) providing a current output responsive to the reflections of said ultrasonic energy and providing a monitor (21) to detect from the current output the indication of completion of the bond. The step of terminating can include the step of terminating the step of applying energy or the step of removing the compressive force from the ball.

9 Claims, 1 Drawing Sheet

6,079,607

METHOD FOR HIGH FREQUENCY BONDING

This application claims priority under 35 USC § 119(e)(1) of provisional application No. 60/044,420 filed Apr. 29, 1997.

BACKGROUND OF THE INVENTION

1. Field of the Invention

This invention relates to a method of monitoring and detecting the idealized end of a ball bonding procedure with automatic termination of the ball bonding procedure in response to such detection.

2. Brief Description of the Prior Art

In the process of semiconductor fabrication, one of the operations involves bonding of wire between pads on the chip and lead fingers of leadframes. This bonding operation generally involves the formation of a thermosonic ball bond to the pad and then threading of the wire attached to the ball bond through a capillary with subsequent formation of a stitch bond to the leadframe lead finger at the other end of the wire with subsequent severing of the stitch bond and wire. The bond of the ball is sometimes referred to as a weld. In the formation of the thermosonic ball bond portion of this operation, the wire is generally pre-heated to a temperature minimally below the flow point of the wire material, generally gold and generally to about 250 degrees C. As the ball contacts the device bond pad, it quickly heats to the device bond pad temperature. The ultrasonic frequency used is optional, it being understood that the industry standard has been 60 KHZ with an improved high frequency version operating at 116 KHz. The ball is then welded to the pad with the continued heating of the ball by ultrasonic energy radiation and by the application of a compressive force between the ball and the pad by the capillary through which the wire is threaded. It is believed that the gold ball changes state as a result of the welding operation, going from a molten state to a crystalline state.

This prior art bonding procedure assumes an ultrasonic power requirement being the same for all ball bonds. Since the temperature of the ball prior to the final bonding can vary from ball to ball (and the flow temperature can also vary due to variations in the wire composition), an underbonding or overbonding situation can be created. As opposed to a fully bonded state when neither an overbonding or underbonding condition exists. In the case of an underbonding, the connection may be inadequate with low intermetallics and cause failure of the device by reason of the bond coming apart at a later time. In the case of an overbonding, the ball size and height are increased, thereby causing a higher standard deviation on ball shear and percent of intermetallics. Also, with increased ball size, there is the possibility of short circuits and breakage of the glass passivation disposed over the bond pad occurring due to flow or other movement of the ball off of the pad and onto an adjacent pad or contact with a wire connected to an adjacent pad during formation of the thermosonic bond. It is apparent that when there is some degree of misalignment between the ball and the pad, the above described problem is exacerbated.

SUMMARY OF THE INVENTION

The above described problem inherent in the prior art is minimized in accordance with the present invention and there is provided a wire bonding procedure whereby the amount of ultrasonic power provided to the ball for heating is varied during each bonding operation to provide the actual heat required for formation of an ideal bond, thereby avoiding both the problem of overbonding as well as underbonding.

Briefly, the above is accomplished by monitoring a parameter which shows a detectable change at some known time relative to completion of the bond. This is accomplished in accordance with the preferred embodiment by monitoring the current in a piezoelectric crystal device resulting from the ultrasonic power fed back in the ultrasonic horn during formation of the ball bond or weld. In operation, ultrasonic energy is fed via a horn to the ball to be bonded to soften the ball. Concurrently, the capillary through which the wire with the ball at its end passes compresses the ball against the pad. During this bonding operation, which is standard, the ultrasonic energy is reflected back in the horn and impinges upon the piezoelectric device. With a constant voltage across the piezoelectric device, the current output from this device will rise to some level and stay at that level until the bond is completed. At this point in time, there is an inflection in the current provided by the piezoelectric device. This current is monitored and, upon sensing of the deflection in current, either the power to the oscillator providing the ultrasonic energy is cut off and the capillary is lifted off of the pad, thereby ending the ball bonding procedure. Any additional bonding energy would cause overbonding. The inflection point is a point where there is a sudden increase or decrease in the current measured. The bond may form very early in the bond cycle before the current to the horn has reached full amplitude. This occurrence is detected in accordance with the present invention to prevent any overbonding.

DESCRIPTION OF THE PREFERRED EMBODIMENT

Figure 1:
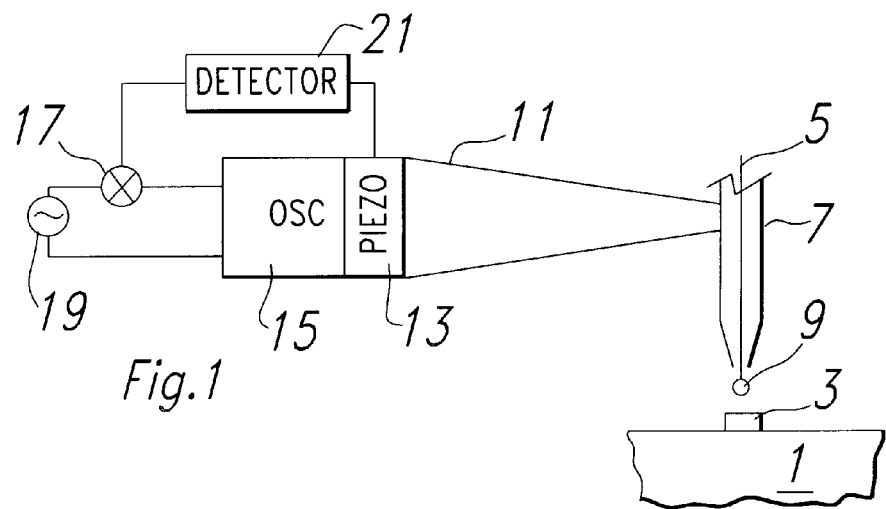
FIG. 1 is a schematic diagram of a system for bonding a wire to a pad and particularly for formation of a ball bond.

With reference to FIG. 1, there is shown a system for monitoring and controlling the ball bonding operation in accordance with the present invention. There is shown a pad 3 on a semiconductor chip 1 to which the ball bond is to be made. A thin gold wire 5 extends through the bore of a capillary 7 and has a ball 9 formed at the end of the wire and over the pad 3 due to heating of the wire in standard manner. An ultrasonic horn 11 provides the ultrasonic power to the ball 9 via a oscillator 15. A piezoelectric device 13. The piezoelectric device 13 is disposed within the horn 11 to detect reflected ultrasonic signal within the horn that have been reflected back from the ball 9. The oscillator 15 is driven by a power source 19 which is in series with a controlled switch 17. A current monitor detects the current supplied by the piezoelectric crystal device 13 as a result of the fed back ultrasonic energy within the horn 11 and provides a signal to open the switch 17 when a sudden inflection in the current from the crystal device is detected, indicating a change in state of the gold and completion of the bonding operation.

Figure 2:
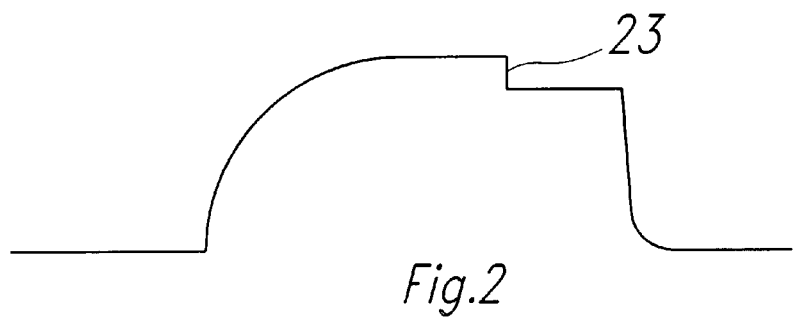
FIG. 2 is a graph showing the current flow to the oscillator 15 during a bonding operation using the system described with reference to FIG. 1.

In general, upon commencement of the bonding operation, the capillary 7 will move toward the pad 3 with the ball 9 striking the pad and the end of the capillary applying a force to the ball against the pad. Concurrently, the current produced by the piezoelectric crystal device 13 will rise to some predetermined value and generally maintain that value. This current is maintained until the bond is completed. At bond completion, there is an inflection in the current flow as shown at 23 in FIG. 2. This is the inflection detected by the current detector 21 as a result of its monitoring of the current flow in the piezoelectric crystal device 13. Upon sensing this inflection in the current flow, the current detector 21 either causes opening of the controlled switch 17 to cut off current flow to the oscillator 15 and causes lifting of the capillary away from the bond, thereby ending the bonding operation and preventing an overbond or an underbond.

Though the invention has been described with reference to a specific preferred embodiment thereof, many variations and modification will immediately become apparent to those skilled in the art. It is therefore the intention that the appended claims be interpreted as broadly as possible in view of the prior art to include all such variations and modifications.

What is claimed is:

1. A method of forming a ball bond or weld during the fabrication of a semiconductor device, comprising the steps of:
    (a) providing a pad and a ball disposed over said pad to be bonded to said pad;
    (b) applying energy from an energy source to said ball to soften said ball while concurrently applying a compressive force to said ball to force said ball against said pad and commence bonding of said ball to said pad;
    (c) detecting at least one parameter responsive to feedback from said bond or weld during formation of said bond or weld which provides an indication of the state of completion of said bond of said ball to said pad; and
    (d) terminating application of said energy to said ball responsive to said detecting of said at least one parameter providing an indication of completion of said bond.

2. The method of claim 1 wherein said energy is ultrasonic energy.

3. The method of claim 1 wherein said step of terminating comprises the step of removing said compressive force from said ball.

4. The method of claim 2 wherein said step of terminating comprises the step of removing said compressive force from said ball.

5. The method of claim 1 wherein said at least one parameter is at least one of said application of energy and said compressive force applied to said ball.

6. A method of forming a ball bond or weld during the fabrication of a semiconductor device, comprising the steps of:
    (a) providing a pad and a gold ball disposed over said pad to be bonded to said pad;
    (b) applying ultrasonic energy from an ultrasonic energy source to said ball to soften said ball while concurrently applying a compressive force to said ball to force said ball against said pad;
    (c) detecting reflections of said ultrasonic energy fed back to said ultrasonic energy source to provide an indication from said fed back ultrasonic energy of completion of said bond of said ball to said pad from said application of energy and compressive force to said ball; and
    (d) terminating application of said energy to said ball responsive to said detecting reflections to provide an indication of completion of said bond.

7. A method of forming a ball bond or weld during the fabrication of a semiconductor device, comprising the steps of:
    (a) providing a pad and a gold ball to be bonded to said pad disposed over said pad;
    (b) applying ultrasonic energy from an ultrasonic energy source to said ball to soften said ball while concurrently applying a compressive force to said ball to force said ball against said pad;
    (c) detecting reflections of said ultrasonic energy to provide an indication of completion of said bond of said ball to said pad from said application of energy and compressive force to said ball; and
    (d) terminating application of said energy to said ball responsive to said detecting reflections to provide an indication of completion of said bond;
    wherein said step of detecting comprises the steps of providing a piezoelectric device providing a current output responsive to said reflection of said ultrasonic energy and providing a monitor to detect from said current output said indication of completion of said bond.

8. The method of claim 6 wherein said step of terminating comprises the step of removing said compressive force from said ball.

9. The method of claim 7 wherein said step of terminating comprises the step of removing said compressive force from said ball.

* * * * *